United States Patent
Yuan

(10) Patent No.: US 8,237,798 B2
(45) Date of Patent: Aug. 7, 2012

(54) IMAGE SENSOR, APPARATUS AND METHOD FOR DETECTING MOVEMENT DIRECTION OF OBJECT

(75) Inventor: Kun-I Yuan, Tu-Cheng (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 416 days.

(21) Appl. No.: 12/629,976

(22) Filed: Dec. 3, 2009

(65) Prior Publication Data

US 2010/0302377 A1 Dec. 2, 2010

(30) Foreign Application Priority Data

May 26, 2009 (CN) .......................... 2009 1 0302634

(51) Int. Cl.
*H04N 5/225* (2006.01)
(52) U.S. Cl. .......................... 348/169; 348/294; 382/103
(58) Field of Classification Search .................. 348/169, 348/294; 382/103
See application file for complete search history.

(56) References Cited

U.S. PATENT DOCUMENTS

| | | | | |
|---|---|---|---|---|
| 7,348,539 | B2* | 3/2008 | Kang et al. | 250/226 |
| 2005/0110053 | A1* | 5/2005 | Shur et al. | 257/253 |
| 2006/0077270 | A1* | 4/2006 | Yuki et al. | 348/294 |
| 2008/0205714 | A1* | 8/2008 | Benkley et al. | 382/126 |
| 2010/0049450 | A1* | 2/2010 | Nagakubo et al. | 702/41 |
| 2010/0284565 | A1* | 11/2010 | Benkley et al. | 382/103 |

* cited by examiner

*Primary Examiner* — Philip B Tran
(74) *Attorney, Agent, or Firm* — Altis Law Group, Inc.

(57) ABSTRACT

An image sensor includes a base, at least a plurality of first sensing elements and second sensing elements formed on the base. The first sensing elements and the second sensing elements are arranged in an alternate fashion. The first sensing elements cooperatively form a first noncontinuous planar sensing surface facing toward an object, and the second sensing elements cooperatively form a second noncontinuous planar sensing surface facing toward the object. The first noncontinuous planar sensing surface is lower than the second noncontinuous planar sensing surface.

9 Claims, 5 Drawing Sheets

IMAGE SENSOR, APPARATUS AND METHOD FOR DETECTING MOVEMENT DIRECTION OF OBJECT

CROSS-REFERENCE TO RELATED APPLICATION

This application is related to a commonly-assigned co-pending application Ser. No. 12/629,975 entitled "APPARATUS AND METHOD FOR DETECTING MOVEMENT DIRECTION OF OBJECT". The above-identified application is filed simultaneously with the present application. The disclosure of the above-identified application is incorporated herein by reference.

BACKGROUND

1. Technical Field

The present disclosure relates to image sensors, and particularly, to an image sensor, an apparatus and a method for detecting a movement direction of an object.

2. Description of Related Art

Image sensors, such as charge coupled device (CCD) and complementary metal oxide semiconductor (CMOS) have been widely used in image capturing apparatuses, and configured (arranged and structured) for detecting images of objects.

Generally, the above-described image sensors each have only one sensing surface, in such cases, for a predetermined image distance between the sensing surface and a lens, only those objects spaced a predetermined object distance from the lens can have clear images on the sensing surface, i.e., only those objects located at the predetermined object plane are clear for the sensing surface, and all of the other objects outside the predetermined distance, including more far from the sensing surface and nearer to the sensing surface would have blurry images on the sensing surface. As such, the above-described image sensors cannot obtain movement direction of the objects.

What is needed, therefore, is an image sensor, apparatus and method which can detect a movement direction of an object.

BRIEF DESCRIPTION OF THE DRAWINGS

Many aspects of the present image sensor, apparatus and method can be better understood with reference to the following drawings. The components in the drawings are not necessarily drawn to scale, the emphasis instead being placed upon clearly illustrating the principles of the present image sensor, apparatus and method. Moreover, in the drawings, like reference numerals designate corresponding parts throughout the several views.

DETAILED DESCRIPTION OF EMBODIMENTS

Embodiments of the present image sensor, apparatus and method will now be described in detail below and with reference to the drawings.

Figure 1:
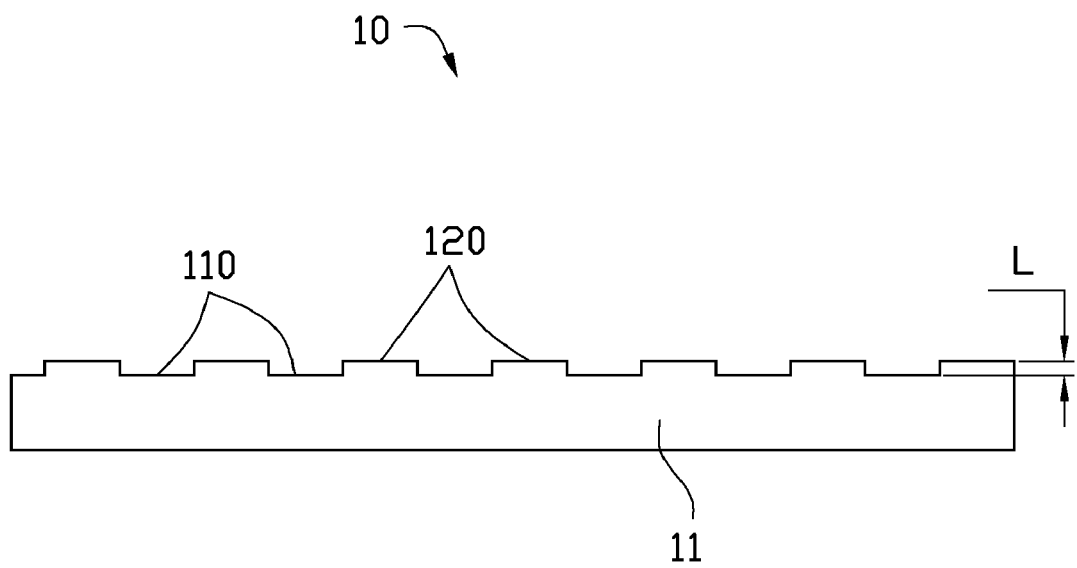
FIG. 1 is a schematic side view of an image sensor in accordance with a first embodiment.

Referring to FIG. 1, an image sensor 10 in accordance with a first embodiment, is shown. The image sensor 10 includes a base 11, a plurality of first sensing elements 110 and a plurality of second sensing elements 120 formed on the base 11.

The base 11 can be made of semiconductor elements, such as silicon. The first sensing elements 110 and the second sensing elements 120 are arranged in a alternate fashion with one of the first sensing elements 110 adjoining one of the second sensing elements 120. Each of the first and second sensing elements 110, 120 is elongated from the side of the base 11 to the opposite side of the base 11. The first sensing elements 110 cooperatively form a first noncontinuous planar sensing surface facing an object, and the second sensing elements 120 cooperatively form a second noncontinuous planar sensing surface facing the object. The first noncontinuous planar sensing surface is parallel to the second noncontinuous planar sensing surface, and the first noncontinuous planar sensing surface is lower than the second noncontinuous planar sensing surface a certain distance L. The certain distance L can be varied according to need.

First objects (not shown), which are spaced a first predetermined distance from the first sensing elements 110 can have clear images on the first noncontinuous planar sensing surface, otherwise the first objects can only have blurry images on the first noncontinuous planar sensing surface, and image quality of the blurry images depend on how far away the first objects are located outside the first predetermined distance from the first noncontinuous planar sensing surface. Herein and after, image quality means the degree of clarity of the images, e.g. definition and/or resolution of the images. Second objects (not shown), which are spaced a second predetermined distance from the second sensing elements 120 can have clear images on second noncontinuous planar sensing surface, otherwise the second objects can only have blurry images on the second noncontinuous planar sensing surface, and image qualities of the blurry images depend on how far away the second objects are located outside the second predetermined distance from the second noncontinuous planar sensing surface.

According to the optical formula $1/u+1/v=1/f$ (wherein u represents an object distance between object and lens, v represents an image distance between lens and image sensor, and f represents a focal length of lens), if a lens is disposed in front of the image sensor 10, because the image distance associated with the first sensing elements 110 is greater than the image distance associated with the second sensing elements 120, the object distance associated with the first sensing elements 110 is shorter than the object distance associated with the second sensing elements 120. That is, a first object plane $P_1$ (see FIG. 5) associated with the first sensing elements 110 is nearer to a reference on the image sensor 10 (e.g., the bottom surface or the center of image sensor 10) than a second object plane $P_2$ (see FIG. 5) associated with the second sensing elements 120 to the same reference on the image sensor 10. According to this principle, when an object is located nearer to the first object plane $P_1$ which is spaced the first predetermined distance from the first noncontinuous planar sensing surface than to the second object plane $P_2$ which is spaced the second predetermined distance from the second noncontinuous planar sensing surface, the first noncontinuous planar sensing surface forms clearer image signals associated with the object than the second noncontinuous planar sensing surface does; when an object is located nearer to the second object plane $P_2$ than to the first object plane $P_1$, the second noncontinuous planar sensing surface forms clearer image signals associated with the object than the first noncontinuous planar sensing surface does.

Figure 2:
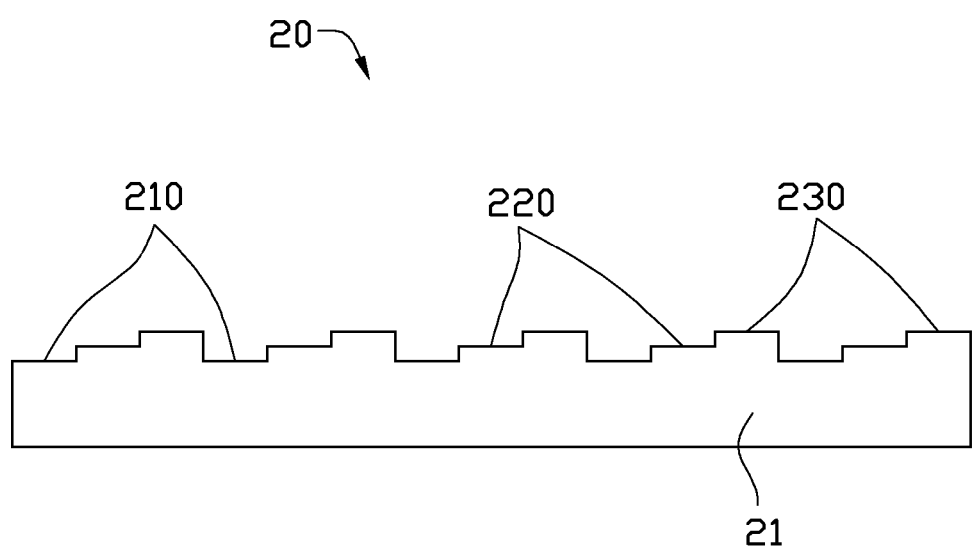
FIG. 2 is a schematic side view of an image sensor in accordance with a second embodiment.
Figure 3:
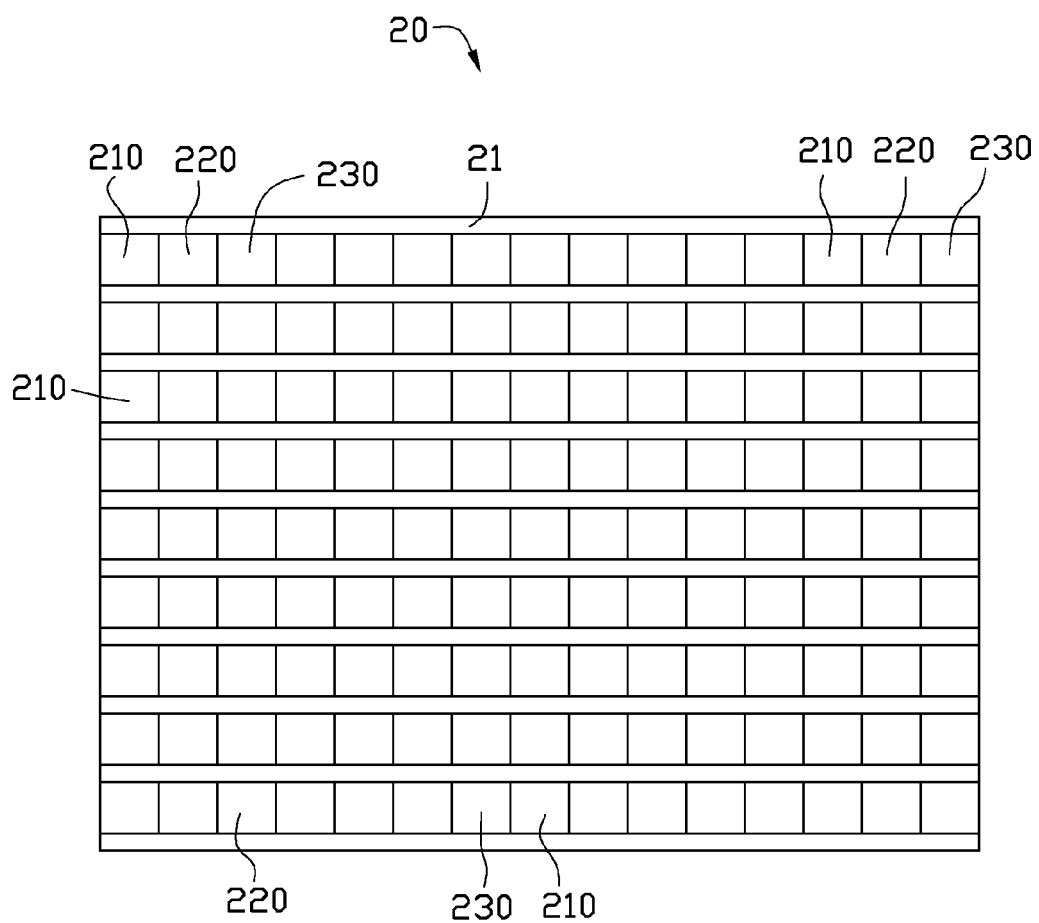
FIG. 3 is top plan view of the image sensor of FIG. 2.

Referring to FIGS. 2 and 3, an image sensor 20 in accordance with a second embodiment, is shown. The image sensor 20 includes a base 21, a plurality of columns of first sensing elements 210, a plurality of columns of second sensing elements 220 and a plurality of columns of third sensing elements 230. Each of the columns of first sensing elements 210 includes a plurality of square-shaped first sensing elements 210; each of the columns of second sensing elements 220 includes a plurality of square-shaped second sensing elements 220, and each of the columns of third sensing elements 230 includes a plurality of square-shaped third sensing elements 230. In each column, two adjacent of the first sensing elements 210, the second sensing elements 220, the third sensing elements 230 are spaced apart a same distance. The columns of first sensing elements 210, the columns of second sensing elements 220 and the columns of third sensing elements 230 are arranged in sequence from a side of the base 21 to an opposite side of the base 21, with the first sensing elements 210 adjoining the second sensing elements 220, the second sensing elements 220 adjoining the third sensing elements 230, and the third sensing elements 230 adjoining the first sensing elements 210. The first sensing elements 210 cooperatively form a first noncontinuous planar sensing surface, the second sensing elements 220 cooperatively form a second noncontinuous planar sensing surface, and the third sensing elements 230 cooperatively form a third noncontinuous planar sensing surface. The first noncontinuous planar sensing surface is lower than the second noncontinuous planar sensing surface, and the second noncontinuous planar sensing surface is lower than the third noncontinuous planar sensing surface.

Figure 4:
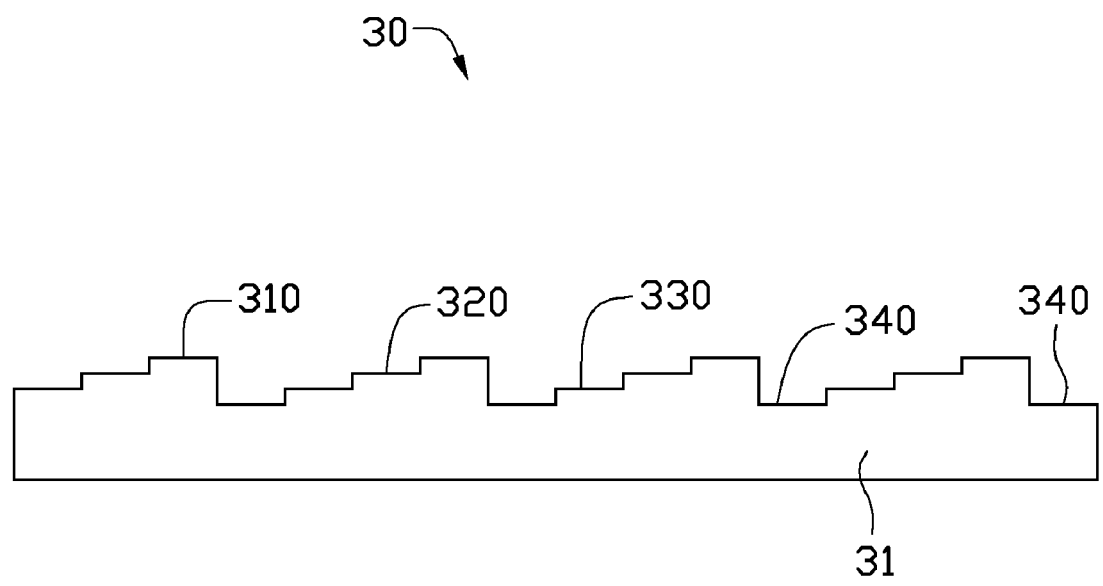
FIG. 4 is a schematic side view of an image sensor in accordance with a third embodiment.

Referring to FIG. 4, an image sensor 30 in accordance with a third embodiment, is shown. The image sensor 30 includes a base 31, a plurality of first sensing elements 340, a plurality of second sensing elements 330, a plurality of third sensing elements 320 and a plurality of fourth sensing elements 310. The first sensing elements 340 cooperatively form a first noncontinuous planar sensing surface of the base 31, the second sensing elements 330 cooperatively form a second noncontinuous planar sensing surface of the base 31, the third sensing elements 320 cooperatively form a third noncontinuous planar sensing surface of the base 31, and the fourth sensing elements 310 cooperatively form a fourth noncontinuous planar sensing surface of the base 31. The first noncontinuous planar sensing surface is lower than the second noncontinuous planar sensing surface, the second noncontinuous planar sensing surface is lower than the third noncontinuous planar sensing surface, and the third noncontinuous planar sensing surface is lower than the fourth noncontinuous planar sensing surface.

Figure 5:
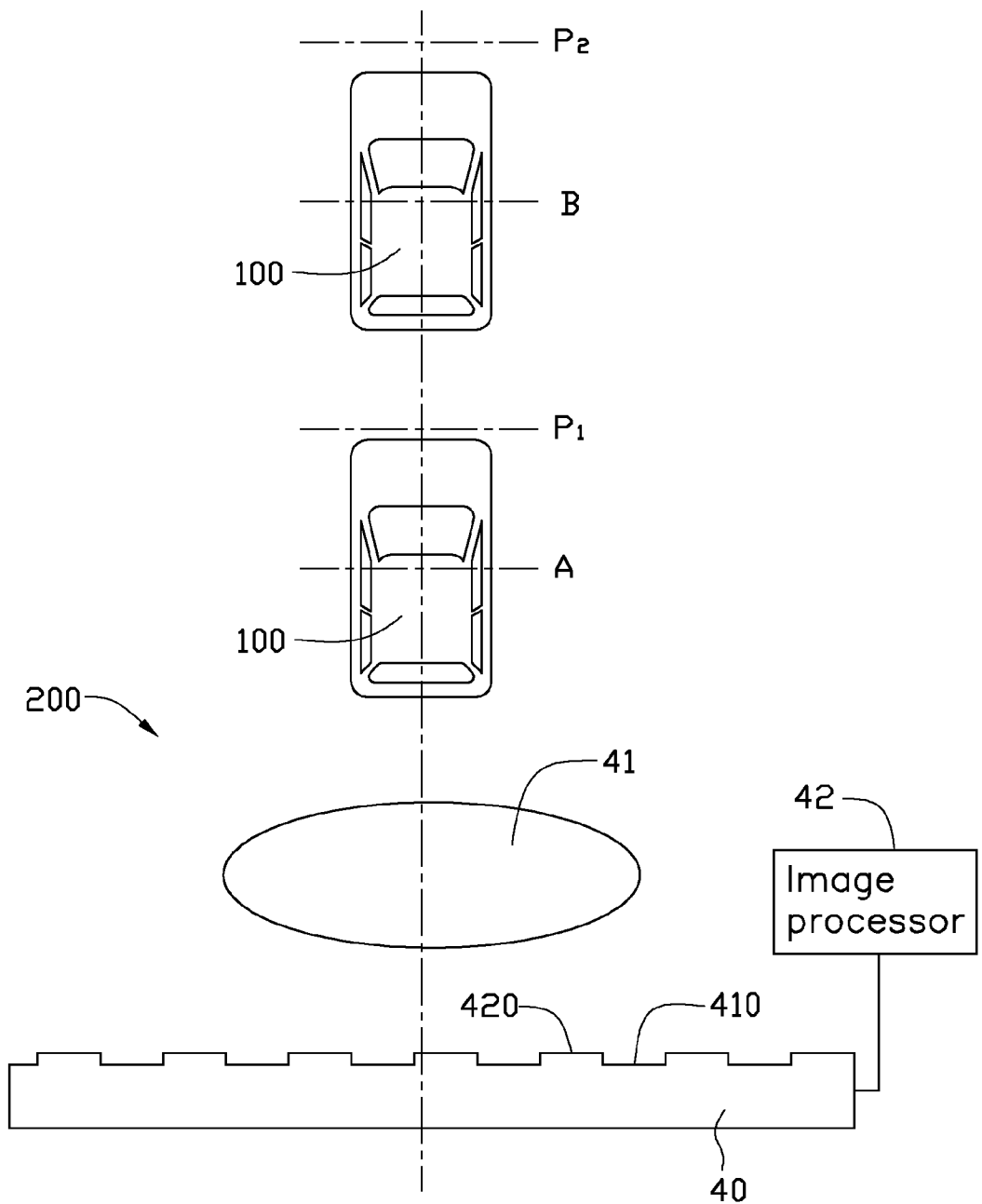
FIG. 5 is a schematic side view of an apparatus for detecting movement direction of an object in accordance with a fourth embodiment.

Referring to FIG. 5, an apparatus 200 for detecting movement direction of an object 100 in accordance with a fourth embodiment, is shown. The apparatus 200 includes a lens 41, an image sensor 40, and an image processor 42. The lens 41 is disposed in front of the image sensor 40, and is a converging lens for converging light from the object 100 to the image sensor 40. The image sensor 40 is similar to the image sensor 10 described above, and includes a plurality of first sensing elements 410 forming a lower noncontinuous planar sensing surface and a plurality of second sensing elements 420 forming a higher noncontinuous planar sensing surface. The image processor 42 is electrically connected to each of the first sensing elements 410 and each of the second sensing elements 420.

In operation, when an object 100 is located at a position A, a first image of the object is captured by the first sensing elements 410, and a second image of the object 100 is captured by the second sensing elements 420. The image processor 42 analyzes and compares image qualities of the first and second images. If the first image is clearer than the second image, it can be obtained that the object 100 is nearer to the first object plane $P_1$ spaced the first predetermined distance from the first noncontinuous planar sensing surface than to the second object plane $P_2$ spaced the second predetermined distance from the second noncontinuous planar sensing surface. In other words, if the first image is clearer than the second image, the object 100 (also the position A) is more adjacent to the first object plane $P_1$ associated with the first sensing elements 410 than the second object plane $P_2$ associated with the second sensing elements 420.

Next, when the object 100 is located at a position B, a third image of the object 100 is captured by the first sensing elements 410, and a fourth image of the object 100 is captured by the second sensing elements 420. The image processor 42 then analyzes and compares image quality of the third and fourth images with the same principle. If the fourth image is clearer than the third image, the object 100 (also the position B) is more adjacent to the second object plane $P_2$ associated with the second sensing elements 410 than the first object plane $P_1$ associated with the first sensing elements 420. Concluded from the above analysis, the object 100 moves almost in a direction away from the image sensor 40.

With the above-described configuration and method, by referring to the first object plane $P_1$ and the second object plane $P_2$, and using a principle that the higher degree of clarity of the first, second, third and fourth images, the closer the object 100 to the corresponding object planes $P_1, P_1$, a vertical movement direction of the object 100 can be obtained; and by analyzing positions of the images on the first sensing elements 410 and the second sensing elements 420, a transverse movement direction of the object 100 can be obtained.

It is understood that the above-described embodiments are intended to illustrate rather than limit the embodiment. Variations may be made to the embodiments and methods without departing from the spirit of the invention. Accordingly, it is appropriate that the appended claims be construed broadly and in a manner consistent with the scope of the embodiment.

What is claimed is:

1. An image sensor, comprising:
   a base;
   a plurality of first sensing elements and second sensing elements formed on the base, the first sensing elements and the second sensing elements being arranged in an alternate fashion, the first sensing elements cooperatively forming a first noncontinuous planar sensing surface facing toward an object, the second sensing elements cooperatively forming a second noncontinuous planar sensing surface facing toward the object, and the first noncontinuous planar sensing surface being lower than the second noncontinuous planar sensing surface.

2. The image sensor as described in claim 1, wherein the base is made of silicon.

3. The image sensor as described in claim 1, wherein the second noncontinuous planar sensing surface is parallel to the first noncontinuous planar sensing surface.

4. The image sensor as described in claim 1, further comprising a plurality of third sensing elements cooperatively forming a third noncontinuous planar sensing surface facing the object.

5. An apparatus for detecting a movement direction of an object, the apparatus comprising:
   an image sensor comprising a base; and a plurality of first sensing elements and second sensing elements formed on the base, the first sensing elements and the second sensing elements being arranged in an alternate fashion, the first sensing elements cooperatively forming a first noncontinuous planar sensing surface facing toward an object, the second sensing elements cooperatively forming a second noncontinuous planar sensing surface facing toward the object, the first noncontinuous planar sensing surface being lower than the second noncontinuous planar sensing surface; and an image processing unit electrically connected to the first and second sensing elements, the image processing unit configured for determining the movement direction of the object by analyzing image quality of the images of the object formed on the first and second noncontinuous planar sensing surfaces.

6. The apparatus as described in claim 5, further comprising a converging lens disposed adjacent to the image sensor.

7. The apparatus as described in claim 5, wherein the second noncontinuous planar sensing surface is parallel to the first noncontinuous planar sensing surface.

8. A method for detecting a movement direction of an object, the method comprising:

providing an image sensor comprising a base; and a plurality of first sensing elements and second sensing elements formed on the base, the first sensing elements and the second sensing elements being arranged in an alternate fashion, the first sensing elements cooperatively forming a first noncontinuous planar sensing surface facing toward an object, the second sensing elements cooperatively forming a second noncontinuous planar sensing surface facing toward the object noncontinuous planar sensing surface noncontinuous planar sensing surface, the first noncontinuous planar sensing surface being lower than the second noncontinuous planar sensing surface;

capturing a first image of the object using at least one of the first sensing elements and capturing a second image of the object using at least one of the second sensing elements when the object is located at a first position;

analyzing the degree of clarity of the first and second images on the first and second noncontinuous planar sensing surfaces;

capturing a third image of the object using at least one of the first sensing elements and capturing a fourth image of the object using at least one of the second sensing elements when the object is located at a second position;

analyzing the degree of clarity of the third and fourth images on the first and second noncontinuous planar sensing surfaces; and determining a movement direction of the object based on the degree of clarity of the first, second, third and fourth images of the object.

9. The method as described in claim 8, further comprising a step of analyzing positions of the first, second, third and fourth images on the first and second sensing elements to obtain a transverse movement direction of the object.

* * * * *